(12) United States Patent
Lien

(10) Patent No.: US 9,362,914 B2
(45) Date of Patent: Jun. 7, 2016

(54) SAMPLING CIRCUIT FOR SAMPLING SIGNAL INPUT AND RELATED CONTROL METHOD

(71) Applicant: MEDIATEK INC., Hsin-Chu (TW)

(72) Inventor: Yuan-Ching Lien, Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 127 days.

(21) Appl. No.: 14/275,896

(22) Filed: May 13, 2014

(65) Prior Publication Data

US 2015/0333755 A1    Nov. 19, 2015

(51) Int. Cl.
| | |
|---|---|
| *G11C 27/02* | (2006.01) |
| *H03K 19/0175* | (2006.01) |
| *H03M 1/08* | (2006.01) |
| *H03M 1/12* | (2006.01) |

(52) U.S. Cl.
CPC ............ *H03K 19/0175* (2013.01); *G11C 27/02* (2013.01); *G11C 27/024* (2013.01); *H03M 1/0836* (2013.01); *H03M 1/121* (2013.01)

(58) Field of Classification Search
CPC .............................. H03K 19/0175; G11C 27/02
USPC ........................................................... 327/94
See application file for complete search history.

(56) References Cited

U.S. PATENT DOCUMENTS

| | | | | |
|---|---|---|---|---|
| 5,084,634 | A | 1/1992 | Gorecki | |
| 7,786,968 | B2* | 8/2010 | Yokoyama | ........... G09G 3/3688 345/100 |
| 2005/0134352 | A1* | 6/2005 | Yokoyama | ........... G09G 3/3688 327/291 |
| 2011/0018589 | A1 | 1/2011 | Lee | |
| 2013/0093464 | A1* | 4/2013 | Noh | .................... H03K 19/0175 326/82 |
| 2013/0293265 | A1* | 11/2013 | Noh | .................... H03K 19/0175 326/46 |
| 2014/0028345 | A1* | 1/2014 | Oh | .................. H03K 19/017545 326/30 |

* cited by examiner

*Primary Examiner* — Ryan Jager
(74) *Attorney, Agent, or Firm* — Winston Hsu; Scott Margo

(57) ABSTRACT

A sampling circuit for sampling a signal input includes a signal generation circuit, a sampling switch and a control circuit. The signal generation circuit is arranged for generating a first control signal. The sampling switch has a control node, and is arranged for determining a sampling time of the signal input according to a signal level at the control node. The control circuit is arranged for controlling the signal level at the control node, wherein when the signal level at the control node corresponds to a first level, and before a signal level of the first control signal is changed in order to adjust the signal level at the control node to a second level, the control circuit couples the first control signal to the control node.

16 Claims, 6 Drawing Sheets

SAMPLING CIRCUIT FOR SAMPLING SIGNAL INPUT AND RELATED CONTROL METHOD

BACKGROUND

The disclosed embodiments of the present invention relate to signal sampling, and more particularly, to a sampling circuit and a related control method capable of reducing mismatch sources between signal paths.

A time-interleaved architecture is traditionally used to realize a high speed and high resolution analog-to-digital converter (ADC). However, offset errors, gain errors, and timing skews may degrade the performance of the time-interleaved ADC. Compared to the offset errors and the gain errors, the timing skews are more difficult to reduce. Even though the amount of time it takes to transmit an input signal to each signal path (or each channel) is identical, devices in signal paths are unmatched due to process limitation.

One conventional method for reducing the timing skews is to use the master clock sampling technique. The device mismatch still occurs in the control logic of the master clock sampling. Thus, there is a need for a novel circuit design to solve the timing skew problem.

SUMMARY

In accordance with exemplary embodiments of the present invention, a sampling circuit capable of reducing mismatch sources between signal paths and a related control method thereof are proposed to solve the above-mentioned problem.

According to a first aspect of the present invention, an exemplary sampling circuit for sampling a signal input is disclosed. The exemplary sampling circuit comprises a signal generation circuit, a sampling switch and a control circuit. The signal generation circuit is arranged for generating a first control signal. The sampling switch has a control node, and is arranged for determining a sampling time of the signal input according to a signal level at the control node. The control circuit is arranged for controlling the signal level at the control node, wherein when the signal level at the control node corresponds to a first level, and before a signal level of the first control signal is changed in order to adjust the signal level at the control node to a second level, the control circuit couples the first control signal to the control node.

According to a second aspect of the present invention, an exemplary control method for a sampling circuit is disclosed. The sampling circuit comprises a sampling switch having a control node. The sampling switch determines a sampling time of a signal input according to a signal level at the control node. The control method comprises the following steps: generating a first control signal; and when the signal level at the control node corresponds to a first level, and before a signal level of the first control signal is changed in order to adjust the signal level at the control node to a second level, coupling the first control signal to the control node.

According to a third aspect of the present invention, an exemplary sampling circuit for sampling a signal input is disclosed. The exemplary sampling circuit comprises a signal generation circuit, a plurality of sampling switches and a control circuit. The signal generation circuit is arranged for generating a first control signal. Each sampling switch has a control node, and is arranged for determining a sampling time of the signal input according to a signal level at the control node. The control circuit is arranged for controlling the signal level at the control node of each sampling switch, wherein when the signal level at the control node corresponds to a first level, and before a signal level of the first control signal is changed in order to adjust the signal level at the control node to a second level, the control circuit couples the first control signal to the control node. The control circuit couples the first control signal to control nodes of the sampling switches, alternately.

The proposed sampling circuit and related control method may reduce device mismatch source between channels. More specifically, the device mismatch source may result from sampling switches only, and the timing skew error is greatly reduced. Additionally, a device size of a sampling switch may be increased (e.g. increasing a gate width and/or a gate length of a sampling transistor) to further reduce the device mismatch. Moreover, the proposed sampling circuit may use bottom pate sampling and save buffer circuit(s), and may be merged in a multiplying digital-to-analog converter (MDAC).

These and other objectives of the present invention will no doubt become obvious to those of ordinary skill in the art after reading the following detailed description of the preferred embodiment that is illustrated in the various figures and drawings.

DETAILED DESCRIPTION

In order to reduce timing skews resulting from device mismatch source between signal paths in a time-interleaved sample-and-hold circuit, the proposed sampling scheme employs a single control signal (e.g. a master clock signal) to control sampling switches in different signal paths to thereby perform sampling operations. Additionally, as the proposed sampling scheme may control timing sequence of control logic of a sampling switch, device mismatch between control circuits of sampling switches in different signal paths contributes little to the timing skews.

Figure 1:
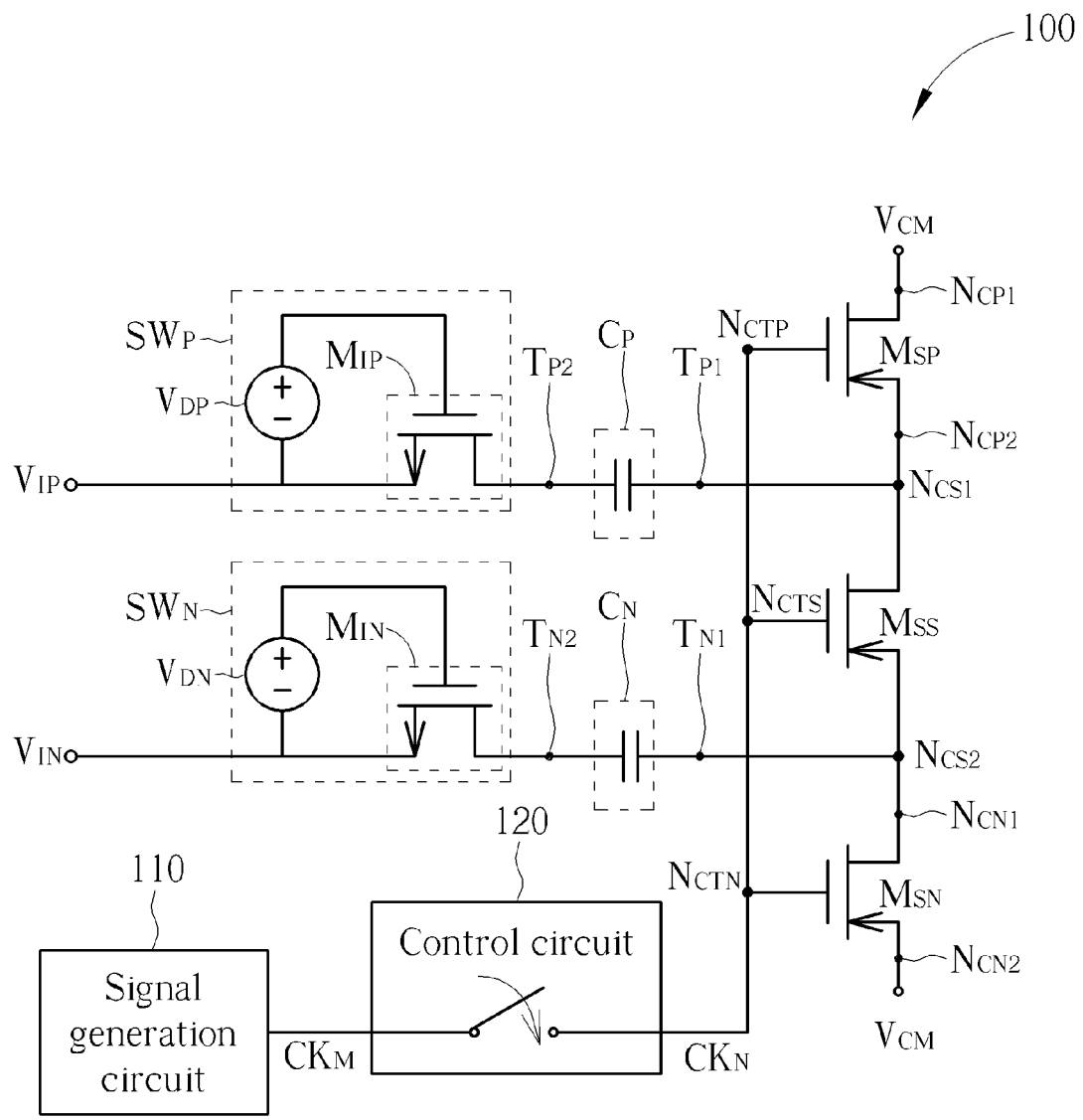
FIG. 1 is a diagram illustrating an exemplary sampling circuit for sampling a signal input according to an embodiment of the present invention.

Please refer to FIG. 1, which is a diagram illustrating an exemplary sampling circuit for sampling a signal input according to an embodiment of the present invention. In this embodiment, the sampling circuit 100 may be regarded as a sampling circuit in a time-interleaved ADC (not shown in FIG. 1). The sampling circuit 100 uses bottom plate sampling to sample the signal input (including an input signal $V_{IP}$ and an input signal $V_{IN}$) in a signal path (or a channel), and may include, but is not limited to, a plurality of input switches $SW_P$ and $SW_N$, a plurality of capacitors $C_P$ and $C_N$, a sampling switch $M_{SS}$, a plurality of transistor switches $M_{SP}$ and $M_{SN}$, a signal generation circuit 110 and a control circuit 120. In a track/sample mode, the input switch $SW_P$ may couple the input signal $V_{IP}$, to a terminal $T_{P2}$ of the capacitor $C_P$, and the sampling switch $M_{SS}$ and the transistor switches $M_{SP}$ and $M_{SN}$ may turn on to sample the input signal $V_{IP}$, wherein a sampling time of the input signal $V_{IP}$ (i.e. the signal input) is determined mainly by a switch state of the sampling switch $M_{SS}$. In a hold mode, the terminal $T_{P2}$ of the capacitor $C_P$ is coupled to ground (not shown in FIG. 1) rather than the input signal $V_{IP}$, and the sampling switch $M_{SS}$ and the transistor switches $M_{SP}$ and $M_{SN}$ turn off. Similarly, the input switch $SW_N$ may selectively couple the input signal $V_{IN}$ to a terminal $T_{N2}$ of the capacitor $C_N$, and a sampling time of the input signal $V_{IN}$ (the signal input) is determined mainly by the switch state of the sampling switch $M_{SS}$. As a person skilled in the art should understand the sample-and-hold operation, further description is omitted here for brevity.

In this embodiment, the input switch $SW_P$ may be implemented by a bootstrap switch (represented by a level shift circuit $V_{DP}$ and a transistor $M_{IP}$), and the input switch $SW_N$ may be implemented by a bootstrap switch (represented by a level shift circuit $V_{DN}$ and a transistor $M_{IN}$). As shown in FIG. 1, the sampling switch $M_{SS}$ has a control node $N_{CTS}$, a connection node $N_{CS1}$ and a connection node $N_{CS2}$, wherein the connection node $N_{CS1}$ is coupled to a terminal $T_{P1}$ of the capacitor $C_P$, the connection node $N_{CS2}$ is coupled to a terminal $T_{N1}$ of the capacitor $C_N$, and the sampling switch $M_{SS}$ may determine a sampling time of the signal input according to a signal level at the control node $N_{CTS}$. The transistor switch $M_{SP}$ has a control node $N_{CTP}$, a connection node $N_{CP1}$ and a connection node $N_{CP2}$, wherein the control node $N_{CTP}$ is coupled to the control node $N_{CTS}$ of the sampling switch $M_{SS}$, the connection node $N_{CP1}$ is coupled to a predetermined voltage $V_{CM}$ (e.g. a common mode voltage provided by a circuit not shown in FIG. 1), and the connection node $N_{CP2}$ is coupled to the connection node $N_{CS1}$ of the sampling switch $M_{SS}$. The transistor switch $M_{SN}$ has a control node $N_{CTN}$, a connection node $N_{CN1}$ and a connection node $N_{CN2}$, wherein the control node $N_{CTN}$ is coupled to the control node $N_{CTS}$ of the sampling switch $M_{SS}$, the connection node $N_{CN1}$ is coupled to the connection node $N_{CS2}$ of the sampling switch $M_{SS}$, and the connection node $N_{CN2}$ is coupled to the predetermined voltage $V_{CM}$.

The signal generation circuit 110 is arranged to generate a control signal $CK_M$ (e.g. a master clock signal) to the control circuit 120, and the control circuit 120 may adjust a signal level of the control node $N_{CTS}$ of the sampling switch $M_{SS}$ (a signal level of a signal $CK_N$) according to the control signal $CK_M$, thereby controlling the switch state of the sampling switch $M_{SS}$. For example, when the signal level of the control node $N_{CTS}$ corresponds to a first level (e.g. a low level), the sampling switch $M_{SS}$ turns on, and when the signal level of the control node $N_{CTS}$ corresponds to a second level different from the first level (e.g. a high level), the sampling switch $M_{SS}$ turns off. In order to reduce the timing skew error due to device mismatch source between channels, when it is intended to adjust the signal level of the control node $N_{CTS}$ from the first level to the second level (i.e. switching the switch state of the sampling switch $M_{SS}$), the control circuit 120 may couple the control signal $CK_M$ to the control node $N_{CTS}$ before the signal level of the control signal $CK_M$ is changed to a specific level in order to adjust the signal level of the control node $N_{CTS}$. In other words, after the control signal $CK_M$ is coupled to the control node $N_{CTS}$, the signal level of the control signal $CK_M$ is changed to the specific level in order to adjust the signal level of the control node $N_{CTS}$ to the second level. When the control signal $CK_M$ having the specific level is transmitted to the control node $N_{CTS}$ through the control circuit 120, the signal transmission path may be regarded as equivalent to a circuit including a resistor. Further description is detailed as follows.

Figure 2:
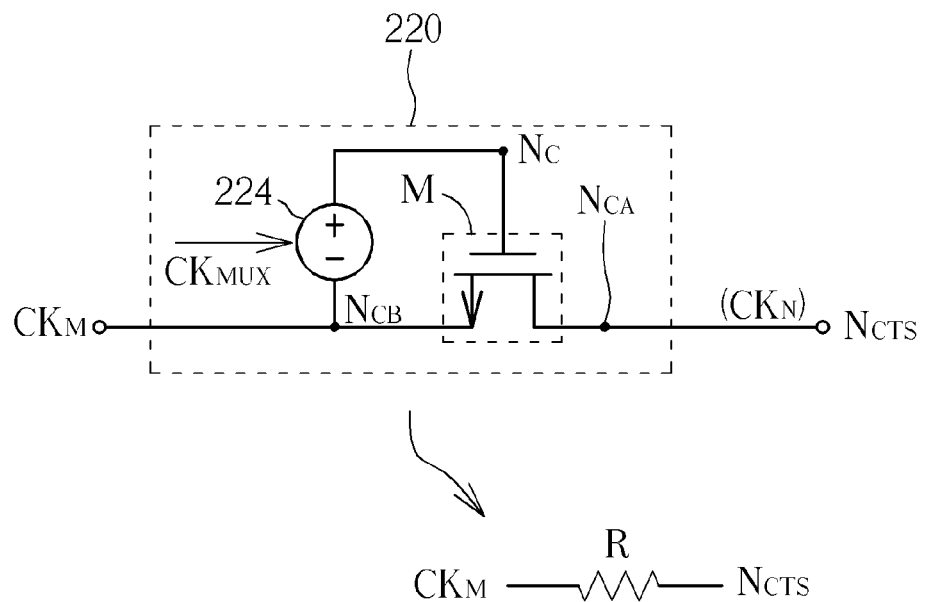
FIG. 2 is a diagram illustrating an exemplary implementation of the control circuit shown in FIG. 1.

FIG. 2 is a diagram illustrating an exemplary implementation of the control circuit 120 shown in FIG. 1. In this implementation, the signal generation circuit 110 shown in FIG. 1 may further generate a control signal $C_{MUX}$ to the control circuit 220. The control circuit 220 may include, but is not limited to, a transistor M and a level shift circuit 224. The transistor M has a control node $N_C$, a connection node $N_{CA}$ and a connection node $N_{CB}$, wherein the connection node $N_{CA}$ is coupled to the control node $N_{CTS}$ of the sampling switch $M_{SS}$, the connection node $N_{CB}$ is coupled to the control signal $CK_M$. The level shift circuit 224 is coupled between the control node $N_C$ and connection node $N_{CB}$, and is arranged to boost a voltage difference between the control node $N_C$ and the connection node $N_{CB}$ according to the control signal $C_{MUX}$. In other words, the level shift circuit 224 is a voltage boosting circuit, and a bootstrap switch may be implemented by the transistor M and the level shift circuit 224.

Before the signal level of the control signal $CK_M$ is changed in order to adjust the signal level of the control node $N_{CTS}$, the control signal $CK_M$ may be coupled to the control node $N_{CTS}$. More specifically, when the signal level of the control node $N_{CTS}$ corresponds to a first level (e.g. a low level), by boosting the voltage difference between the control node $N_C$ and the connection node $N_{CB}$ according to the control signal $C_{MUX}$, the level shift circuit 224 may turn on the transistor M before the signal level of the control signal $CK_M$ is changed to a specific level in order to adjust the signal level of the control node $N_{CTS}$. After the transistor M turns on, an equivalent circuit of the control circuit 220 may be a resistor R.

It should be noted that, as switch element(s) included in a control circuit of a sampling switch is implemented by transistor(s), transistor mismatch may result in timing skews. Timing mismatch may be represented as $m^{-1} \times \Delta V_{th}$, wherein $m^{-1}$ is a reciprocal of rate of change of the signal level of the control signal (e.g. the clock signal) over time, and $\Delta V_{th}$ is a threshold voltage variation between transistors. By employing the aforementioned control scheme, the control circuit of the sampling switch may be modeled by an equivalent circuit including a resistor. Hence, the timing mismatch between channels may result from the equivalent circuit mismatch rather than the expression $m^{-1} \times \Delta V_{th}$. Compared to the expression $m^{-1} \times \Delta V_{th}$, the equivalent circuit mismatch between channels is much smaller, especially when a voltage difference between a gate and a source of a transistor (e.g. the transistor M) is sufficiently large. In brief, the proposed control scheme may greatly improve the performance of the sampling circuit.

Figure 3:
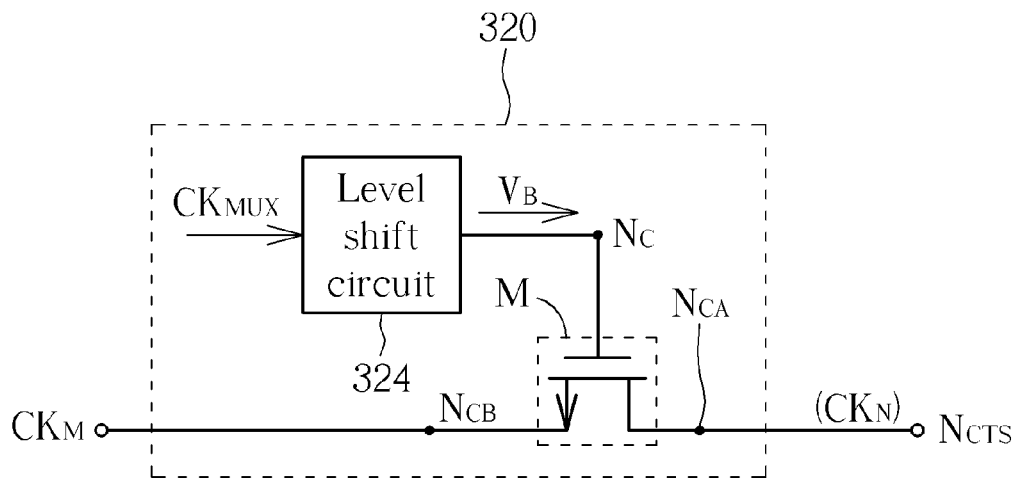
FIG. 3 is a diagram illustrating another exemplary implementation of the control circuit shown in FIG. 1.

Please note that the above is for illustrative purposes only, and is not meant to be a limitation of the present invention. In one implementation, the proposed control logic may be employed in various sampling circuits. For example, the proposed control logic may be employed in a sampling circuit using another bottom plate sampling scheme different from that shown in FIG. 1 (e.g. the input switch $SW_P/SW_N$ may be implemented by other types of switch circuits). In another example, the proposed control logic may be employed in a sampling circuit using top plate sampling. In another implementation, the proposed sampling circuit may perform the sample-and-hold operation upon a single input signal (i.e. a single-ended architecture). Additionally, the aforementioned first/second level is not limited to the low/high level. Moreover, the control circuit 120 shown in FIG. 1 may be implemented in a variety of different circuit topologies. Please refer to FIG. 3, which is a diagram illustrating another exemplary implementation of the control circuit 120 shown in FIG. 1. The architecture of the control circuit 320 is based on that of the control circuit 220 shown in FIG. 2, wherein the main difference is that a level shift circuit 324 included in the control circuit 320 is not coupled between the control node $N_C$ and the connection node $N_{CB}$. The level shift circuit 324 is coupled to the control node $N_C$ of the transistor M, and is arranged to apply a bias voltage $V_B$ to the control node $N_C$ according to the control signal $C_{MUX}$. As long as the applied bias voltage $V_B$ is high enough to turn on the transistor M, an equivalent circuit including a resistor may also be obtained.

Figure 4:
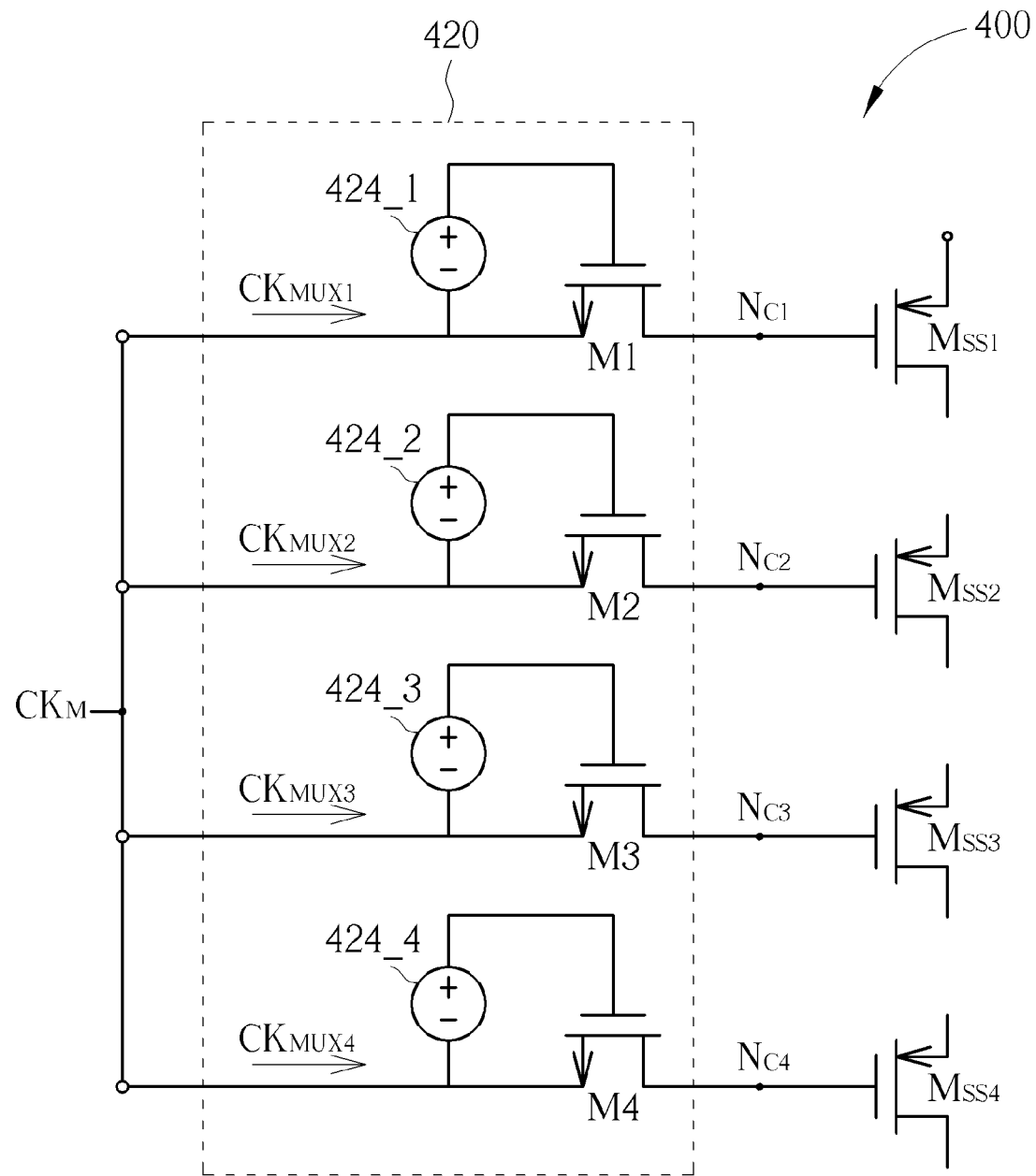
FIG. 4 is a diagram illustrating an exemplary sampling circuit for sampling a plurality of channels according to an embodiment of the present invention.

To gain a better understanding of the proposed control scheme, the following describes the operation of an exemplary sampling circuit used in a time-interleaved ADC having four channels. Please refer to FIG. 4, FIG. 5 and FIG. 6 together. FIG. 4 is a diagram illustrating an exemplary sampling circuit for sampling a plurality of channels according to an embodiment of the present invention. In this embodiment, the single channel sampling architecture of the sampling circuit 400 is based on that of the sampling circuit 100 shown in FIG. 1, and the control circuit 420 for controlling a switch state of a sampling switch $M_{SS1}/M_{SS2}/M_{SS3}/M_{SS4}$ may be implemented based on the control circuit 220 shown in FIG. 2. As shown in FIG. 4, the control circuit 420 may include at least a transistor (i.e. a transistor $M_1/M_2/M_3/M_4$) and a level shift circuit (i.e. a level shift circuit 424_1/424_2/424_3/424_4) within each channel, wherein each level shift circuit is controlled by a control signal (i.e. a control signal $CK_{MUX1}/CK_{MUX2}/CK_{MUX3}/CK_{MUX4}$) to selectively couple the control signal $CK_M$ to a control node of each transistor (i.e. a control node $N_{C1}/N_{C2}/N_{C3}/N_{C4}$).

Figure 5:
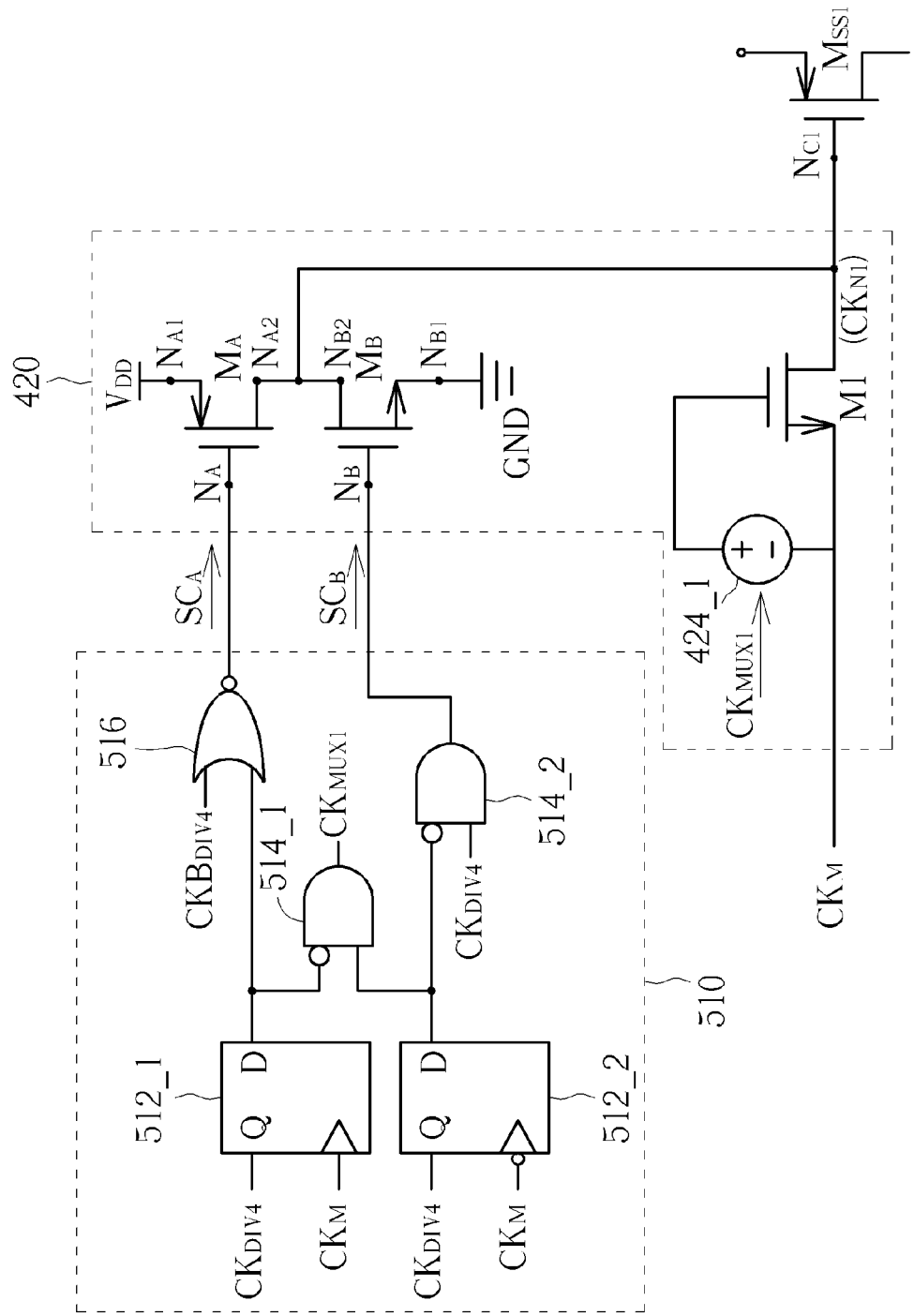
FIG. 5 is a diagram illustrating an exemplary implementation of control logic of the sampling switch shown in FIG. 4.
Figure 6:
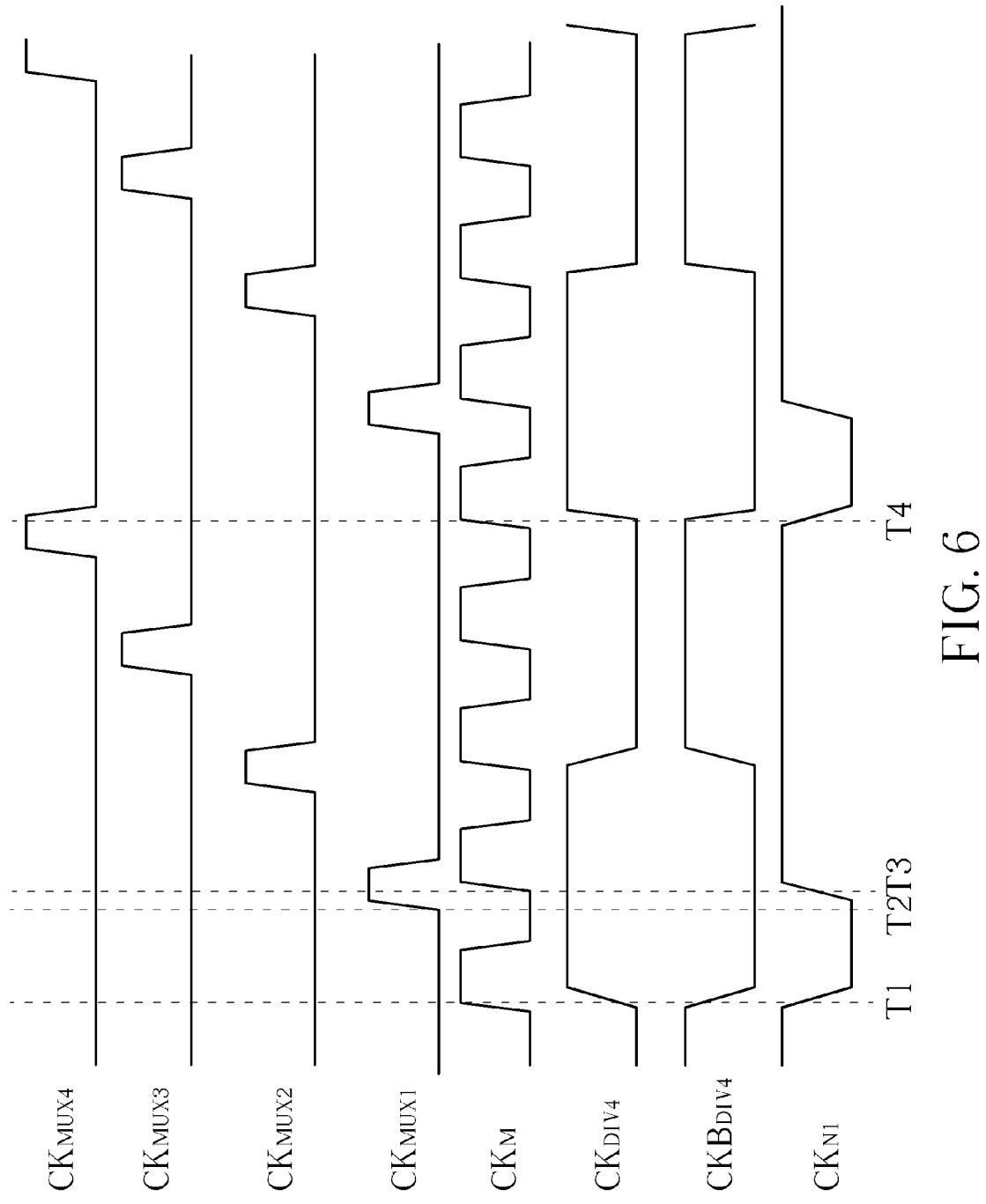
FIG. 6 is a timing diagram of a plurality of signals shown in FIG. 5.

FIG. 5 is a diagram illustrating an exemplary implementation of control logic of the sampling switch $M_{SS1}$ shown in FIG. 4. FIG. 6 is a timing diagram of a plurality of signals shown in FIG. 5. In the embodiment shown in FIG. 5, in order to enhance the performance of the sampling circuit 400, the control circuit 420 may further include, but is not limited to, a plurality of transistors $M_A$ and $M_B$. The transistors $M_A$ and $M_B$ are arranged for controlling the switch state of the sampling switch $M_{SS1}$. More specifically, the transistors $M_A$ and $M_B$ may adjust a signal level of the control node $N_{C1}$ according to control signals $SC_A$ and $SC_B$. As shown in FIG. 5, the transistor $M_A$ has a control node $N_{CA}$, a connection node $N_{A1}$ and a connection node $N_{A2}$, wherein the control node $N_{CA}$ is coupled to the control signal $SC_A$, the connection node $N_{A1}$ is coupled to a reference voltage $V_{DD}$ (e.g. a supply voltage), and the connection node $N_{A2}$ is coupled to the control node $N_{C1}$. The transistor $M_B$ has a control node $N_{CB}$, a connection node $N_{B1}$ and a connection node $N_{B2}$, wherein the control node $N_{CB}$ is coupled to the control signal $SC_B$, the connection node $N_{B1}$ is coupled to a ground voltage GND, and the connection node $N_{B2}$ is coupled to the control node $N_{C1}$.

In this embodiment, the signal generation circuit 510 may generate the control signal $CK_M$ (e.g. a master clock signal) based on the circuit architecture of the signal generation circuit 110 shown in FIG. 1. In addition, the signal generation circuit 510 may further generate a frequency-divided signal $CK_{DIV4}$ and an inverted signal $CKB_{DIV4}$ thereof, and include a plurality of flip-flops 512_1 and 512_2, a plurality of AND gates 514_1 and 514_2, and a NOR gate 516. The flip-flop 512_1 is a positive edge-triggered D-type flip-flop, and the flip-flop 512_2 is a negative edge-triggered D-type flip-flop. The NOR gate 516 generates the control signal $SC_A$ according to an output signal of the flip-flop 512_1 and the inverted frequency-divided signal $CKB_{DIV4}$; the AND gate 514_1 generates the control signal $CK_{MUX1}$ according to an inverted output signal of the flip-flop 512_1 and an output signal of the flip-flop 512_2; and the AND gate 514_2 generates the control signal $SC_B$ according to an inverted output signal of the flip-flop 512_2 and the frequency-divided signal $CK_{DIV4}$.

As shown in FIG. 6, at a time point T1, a signal level of a signal $CK_{N1}$ (i.e. the signal level of the control node $N_{C1}$) is changed from a high level to a low level. At a time point T2, a signal level of the control signal $CK_{MUX1}$ is changed to the high level in order to turn on the transistor $M_1$ (i.e. start sampling), wherein the signal level of the control signal $CK_M$ corresponds to the low level at this moment. Next, at a time point T3, the signal level of the control signal $CK_{MUX1}$ has been changed to the high level (i.e. the transistor $M_1$ turns on), while the signal level of the control signal $CK_M$ is changed from the low level to the high level. Hence, the signal level of the signal $CK_{N1}$ is changed from the low level to the high level (i.e. enter the hold mode). It should be noted that, during a full period of the frequency-divided signal $CK_{DIV4}$, each control signal may turn on the corresponding sampling switch once. To put it another way, the control circuit 420 may couple the control signal $CK_M$ to the control nodes $N_{C1}$-$N_{C4}$, alternately, wherein the control circuit 420 may couple the control signal $CK_M$ to one control node (i.e. the control node $N_{C1}/N_{C2}/N_{C3}/N_{C4}$) at a time. Therefore, an equivalent load of the control signal $CK_M$ may be reduced so that fast transition between signal levels may be provided.

In the embodiment shown in FIG. 5, after the signal level of the control node $N_{C1}$ is adjusted to the high level (e.g. after the time point T3), the control circuit 420 may further turn on the transistor $M_A$ according to the control signal $SC_A$ in order to maintain the signal level of the control signal $CK_{N1}$ at the high level for a predetermined period of time (e.g. a period of time between the time point T3 and the time point T4). Hence, the control signal $CK_M$ may be coupled to control nodes one at a time. More specifically, during the predetermined period of time, the control signals $CK_{MUX2}$-$CK_{MUX4}$ may turn on the corresponding transistors (i.e. the transistors $M_2$-$M_4$) in sequence. Additionally, the transistor $M_B$ may turn on according to the control signal $SC_B$ (e.g. the time point T1), thereby adjusting the signal level of the signal $CK_{N1}$ to the low level for a follow-up sample operation.

Please note that the above control logic is for illustrative purposes only. In other words, a control circuit capable of controlling the signal $CK_{N1}$ to stay at the high level for a predetermined of time is not limited to that shown in FIG. 5. In addition, other circuit topologies may be employed to generate the control signals shown in FIG. 5. As long as a control scheme may control a signal level of a control node to stay at a predetermined level for a predetermined period of time after the signal level is adjusted to the predetermined level (e.g. the sample operation is completed), it falls within the spirit and scope of the present invention.

Figure 7:
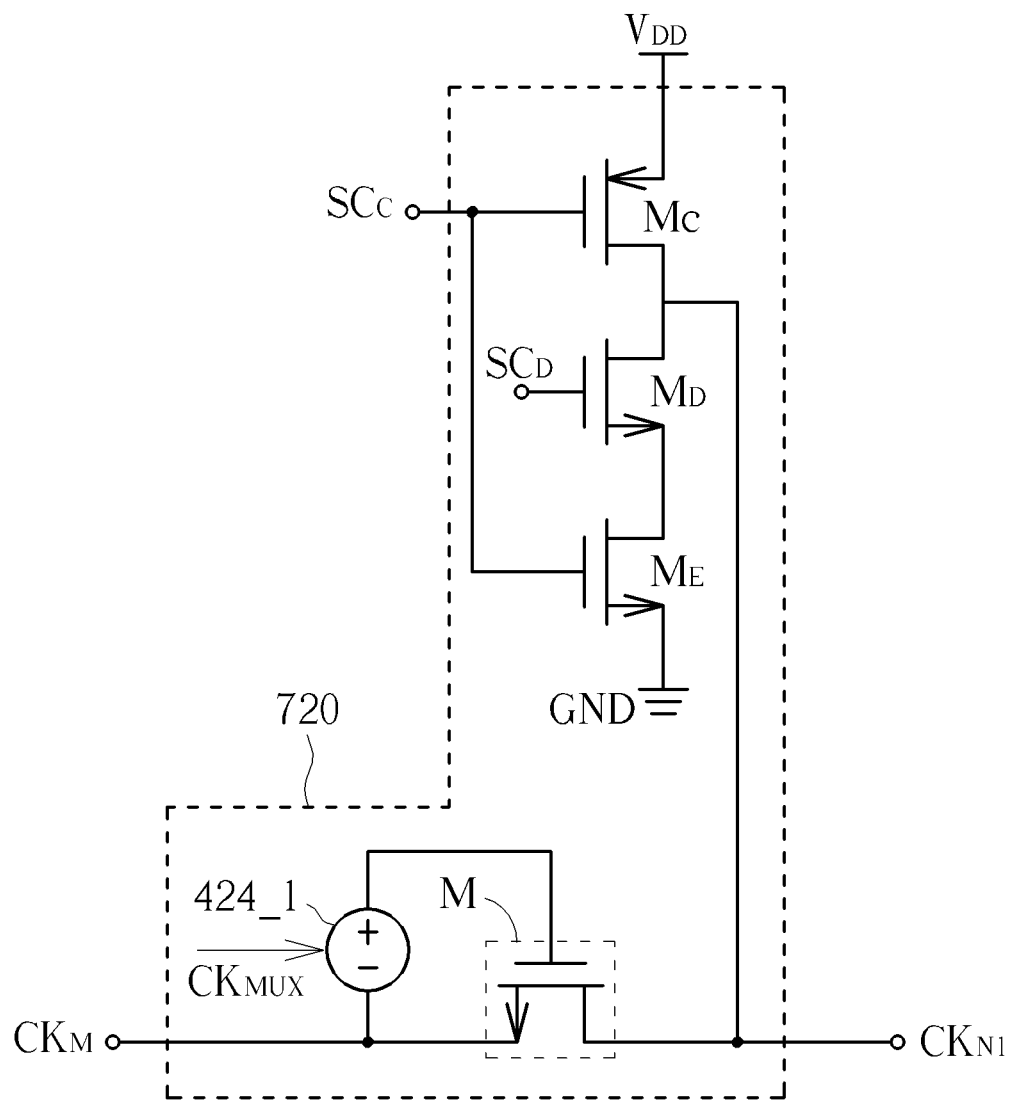
FIG. 7 is a diagram illustrating another exemplary implementation of control logic of the sampling switch shown in FIG. 4.

Please refer to FIG. 7, which is a diagram illustrating another exemplary implementation of control logic of the sampling switch $M_{SS1}$ shown in FIG. 4. The architecture of the control circuit 720 is based on that of the control circuit 420 shown in FIG. 5, wherein the main difference is that the control circuit 720 uses a plurality of transistors $M_C$-$M_E$ to control the signal level of the signal $CK_{N1}$. In this embodiment, the transistors $M_D$ and $M_E$ may adjust the signal level of the signal $CK_{N1}$ to the low level (e.g. the time point T1 shown in FIG. 6) according to the control signals $SC_C$ and $SC_D$ (e.g. both control signals $SC_C$ and $SC_B$ correspond to the high level), and the transistor $M_C$ may control the signal level of the signal $CK_{N1}$ to stay at the high level for a predetermined period of time according to the control signal $SC_C$ (e.g. the control signal $SC_C$ corresponds to the low level). As a person skilled in the art should understand that a control circuit which may provide the control signals $SC_C$ and $SC_B$ may be implemented in a variety of different circuit topologies, further description is omitted here for brevity.

To sum up, the proposed sampling circuit and related control method may reduce device mismatch source between channels. More specifically, the device mismatch source may result from sampling switches only, and the timing skew error is greatly reduced. Additionally, a device size of a sampling switch may be increased (e.g. increasing a gate width and/or a gate length of a sampling transistor) to further reduce the device mismatch. Moreover, the proposed sampling circuit may use bottom pate sampling and save buffer circuit(s), and may be merged in a multiplying digital-to-analog converter (MDAC).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sampling circuit for sampling a signal input, comprising:
   a signal generation circuit, for generating a first control signal;
   a sampling switch, having a control node, the sampling switch arranged for determining a sampling time of the signal input according to a signal level at the control node; and
   a control circuit, for controlling the signal level at the control node, wherein when the signal level at the control node corresponds to a first level, and before a signal level of the first control signal is changed in order to adjust the signal level at the control node to a second level, the control circuit couples the first control signal to the control node.

2. The sampling circuit of claim 1, wherein when the signal level at the control node corresponds to the first level, the sampling switch is turned on, and when the signal level at the control node corresponds to the second level, the sampling switch is turned off.

3. The sampling circuit of claim 1, wherein the first control signal is a clock signal.

4. The sampling circuit of claim 1, wherein the signal generation circuit further generates a second control signal, and the control circuit comprises:
   a transistor, having a control node, a first connection node and a second connection node, wherein the first connection node of the transistor is coupled to the control node of the sampling switch, and the second connection node of the transistor is coupled to the first control signal; and
   a level shift circuit, coupled to at least the control node of the transistor, the level shift circuit arranged for selectively applying a bias voltage to the control node of the transistor according to the second control signal.

5. The sampling circuit of claim 4, wherein the level shift circuit is a voltage boosting circuit coupled between the control node of the transistor and the second connection node of the transistor, and the voltage boosting circuit arranged for applying the bias voltage to the control node of the transistor by boosting a voltage difference between the control node of the transistor and the second connection node of the transistor according to the second control signal.

6. The sampling circuit of claim 1, wherein after the signal level at the control node is adjusted to the second level, the control circuit further controls the signal level at the control node to stay at the second level for a predetermined period of time.

7. The sampling circuit of claim 6, wherein the signal generation circuit further generates a third control signal, and the control circuit comprises:
   a transistor, having a control node, a first connection node and a second connection node, wherein the control node of the transistor is coupled to the third control signal, the first connection node of the transistor is coupled to a reference voltage, and the second connection node of the transistor is coupled to the control node of the sampling switch;
   wherein after the signal level at the control node of the sampling switch is adjusted to the second level, the control circuit controls the signal level at the control node to stay at the second level according to the third control signal.

8. The sampling circuit of claim 1, wherein the sampling switch further has a first connection node, and the sampling circuit further comprises:
   a transistor, having a control node, a first connection node and a second connection node, wherein the control node of the transistor is coupled to the control node of the sampling switch, the first connection node of the transistor is coupled to a predetermined voltage, and the second connection node of the transistor is coupled to the first connection node of the sampling switch;
   a capacitor, wherein a first terminal of the capacitor is coupled to the first connection node of the sampling switch; and
   an input switch, for selectively coupling the signal input to a second terminal of the capacitor.

9. The control method of claim 8, wherein the first control signal is a clock signal.

10. A control method for a sampling circuit, the sampling circuit comprising a sampling switch having a control node, the sampling switch determining a sampling time of a signal input according to a signal level at the control node, the control method comprises:
    generating a first control signal; and
    when the signal level at the control node corresponds to a first level, and before a signal level of the first control signal is changed to adjust the signal level at the control node to a second level, coupling the first control signal to the control node.

11. The control method of claim 10, wherein when the signal level at the control node corresponds to the first level, the sampling switch is turned on, and when the signal level at the control node corresponds to the second level, the sampling switch is turned off.

12. The control method of claim 10, further comprising:
    after the signal level at the control node is adjusted to the second level, controlling the signal level at the control node to stay at the second level for a predetermined period of time.

13. A sampling circuit for sampling a signal input, comprising:
    a signal generation circuit, for generating a first control signal;
    a plurality of sampling switches, each having a corresponding control node, wherein each sampling switch is arranged for determining a sampling time of the signal input according to a signal level at the corresponding control node; and
    a control circuit, for controlling the signal level at the corresponding control node of each sampling switch, wherein when the signal level at the corresponding control node corresponds to a first level, and before a signal level of the first control signal is changed in order to adjust the signal level at the corresponding control node to a second level, the control circuit couples the first control signal to the corresponding control node;

wherein the control circuit couples the first control signal to control nodes of the sampling switches, alternately.

14. The sampling circuit of claim 13, wherein when the signal level at the corresponding control node corresponds to the first level, the sampling switch is turned on, and when the signal level at the corresponding control node corresponds to the second level, the sampling switch is turned off.

15. The sampling circuit of claim 13, wherein the first control signal is a clock signal.

16. The sampling circuit of claim 13, wherein after the signal level at the control node is adjusted to the second level, the control circuit further controls the signal level at the corresponding control node to stay at the second level for a predetermined period of time.

* * * * *